United States Patent
Cabral, Jr. et al.

(10) Patent No.: US 8,129,267 B2
(45) Date of Patent: Mar. 6, 2012

(54) ALPHA PARTICLE BLOCKING WIRE STRUCTURE AND METHOD FABRICATING SAME

(75) Inventors: Cyril Cabral, Jr., Mahopac, NY (US); K. Paul Muller, Wappingers Falls, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 993 days.

(21) Appl. No.: 12/052,881

(22) Filed: Mar. 21, 2008

(65) Prior Publication Data
US 2012/0028458 A1   Feb. 2, 2012

(51) Int. Cl.
*H01L 21/4763* (2006.01)

(52) U.S. Cl. ........ 438/625; 438/687; 257/640; 257/643; 257/663; 257/684

(58) Field of Classification Search .......... 257/640, 257/643, 663, 684; 438/625, 687
See application file for complete search history.

(56) References Cited

U.S. PATENT DOCUMENTS

| | | |
|---|---|---|
| 3,947,957 A | 4/1976 | Luttmer |
| 6,277,745 B1 | 8/2001 | Liu et al. |
| 6,358,842 B1 | 3/2002 | Zhou et al. |
| 6,555,461 B1 | 4/2003 | Woo et al. |
| 6,590,295 B1 | 7/2003 | Liao et al. |
| 6,613,663 B2 * | 9/2003 | Furuya ..................... 438/613 |
| 6,706,629 B1 | 3/2004 | Lin et al. |
| 6,881,609 B2 | 4/2005 | Salmon |
| 6,927,471 B2 | 8/2005 | Salmon |
| 6,987,321 B2 | 1/2006 | Chooi et al. |
| 6,995,084 B2 | 2/2006 | Srivastava et al. |
| 7,078,822 B2 | 7/2006 | Dias et al. |
| 7,081,372 B2 | 7/2006 | Lo |
| 7,122,403 B2 | 10/2006 | Chandran et al. |
| 2005/0218426 A1 * | 10/2005 | Kobayashi et al. ........... 257/177 |
| 2006/0166402 A1 | 7/2006 | Lim et al. |
| 2006/0234473 A1 | 10/2006 | Wong et al. |
| 2007/0026631 A1 | 2/2007 | Lin et al. |

OTHER PUBLICATIONS

Peter C. Salmon, LLC; Leveraging Copper Pillar—Well (CPW) Technology to make advanced Memory Modules; 4 pages.

\* cited by examiner

*Primary Examiner* — Matthew Landau
*Assistant Examiner* — Sonya McCall Shepard
(74) *Attorney, Agent, or Firm* — Schmeiser, Olsen & Watts; Louis J. Parcello

(57) ABSTRACT

An alpha particle blocking structure and method of making the structure. The structure includes: a semiconductor substrate; a set of interlevel dielectric layers stacked from a lowermost interlevel dielectric layer closest to the substrate to a uppermost interlevel dielectric layer furthest from the substrate, each interlevel dielectric layer of the set of interlevel dielectric layers including electrically conductive wires, top surfaces of the wires substantially coplanar with top surfaces of corresponding interlevel dielectric layers; an electrically conductive tot final pad contacting a wire pad of the uppermost interlevel dielectric layer; an electrically conductive plating base layer contacting a top surface of the terminal pad; and a copper block on the plating base layer.

30 Claims, 10 Drawing Sheets

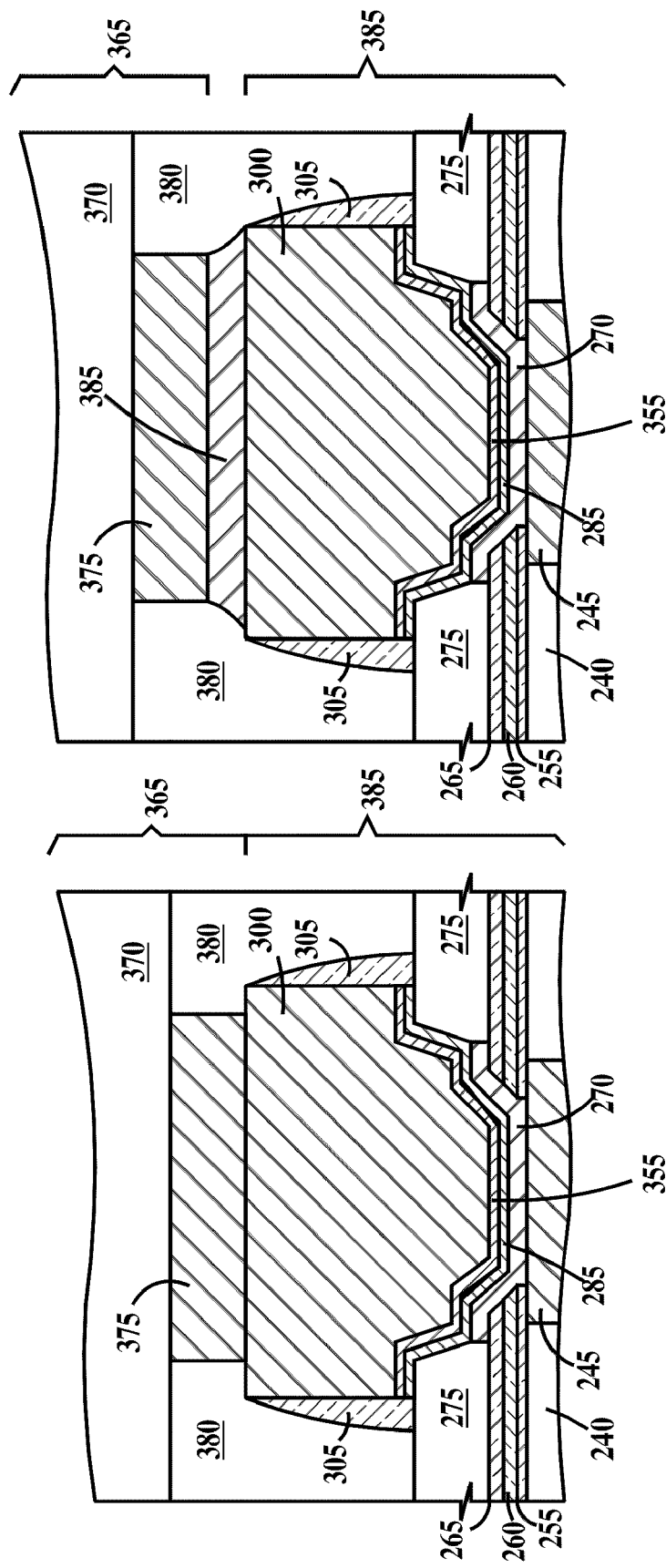

000# ALPHA PARTICLE BLOCKING WIRE STRUCTURE AND METHOD FABRICATING SAME

FIELD OF THE INVENTION

The present invention relates to the field of integrated circuits; more specifically, it relates to alpha particle blocking wire structures and methods of fabricating alpha particle blocking wire structures.

BACKGROUND OF THE INVENTION

It is common practice to connect integrated circuit chips to electronic modules or circuit boards through the use of solders containing lead or a mixture of lead and tin. The solder may contain isotopes that emit alpha particles that can cause failures in the integrated circuit chips. Ceramic and plastic substrates to which integrated circuit chips can be bonded, either using lead solders or other means, can also contain isotopes that emit alpha particles. Since the use of lead and lead/tin solders and ceramic substrates (often used together) is so ubiquitous, improved methods and structures that prevent alpha particles generated in the solder from reaching the alpha particle sensitive regions of the integrated circuit chip are welcomed by the industry.

SUMMARY OF THE INVENTION

A first aspect of the present invention is a structure, comprising: a semiconductor substrate; a set of interlevel dielectric layers stacked from a lowermost interlevel dielectric layer closest to the substrate to a uppermost interlevel dielectric layer furthest from the substrate, each interlevel dielectric layer of the set of interlevel dielectric layers including electrically conductive wires, top surfaces of the wires substantially coplanar with top surfaces of corresponding interlevel dielectric layers; an electrically conductive terminal pad contacting a wire pad of the uppermost interlevel dielectric layer; an electrically conductive plating base layer contacting a top surface of the terminal pad; and a copper block on the plating base layer.

A second aspect of the present invention is a structure, comprising: a semiconductor substrate; a set of interlevel dielectric layers stacked from a lowermost interlevel dielectric layer closest to the substrate to a uppermost interlevel dielectric layer furthest from the substrate, each interlevel dielectric layer of the set of interlevel dielectric layers including electrically conductive wires, top surfaces of the wires substantially coplanar with top surfaces of corresponding interlevel dielectric layers; a dielectric passivation layer on the uppermost interlevel dielectric layer and the top surfaces of the wires of the uppermost interlevel dielectric layer; an organic sealant layer on a top surface of the passivation layer; an electrically conductive first plating base layer on the top surface of the sealant layer; a dielectric layer on a first region of a top surface of the first plating base layer; a first region of an electrically conductive second plating base layer on a top surface of the dielectric layer and a second region of the second plating base layer on a region of the top surface of the first plating base layer not covered by the dielectric layer, the first and second regions of the second plating base layer not in physical contact; a first copper block on the first region of the second plating base layer; and a second copper block on the second region of the second plating base layer.

A third aspect of the present invention is a method, comprising: forming, on a semiconductor substrate, a set of interlevel dielectric layers stacked from a lowermost interlevel dielectric layer closest to the substrate to a uppermost interlevel dielectric layer furthest from the substrate, each interlevel dielectric layer of the set of interlevel dielectric layers including electrically conductive wires, top surfaces of the wires substantially coplanar with top surfaces of corresponding interlevel dielectric layers; forming an electrically conductive terminal pad on a wire pad of the uppermost interlevel dielectric layer; forming an electrically conductive plating base layer contacting a top surface of the terminal pad; and forming a copper block on the plating base layer.

A fourth aspect of the present invention is a method, comprising: forming, on a semiconductor substrate, a set of interlevel dielectric layers stacked from a lowermost interlevel dielectric layer closest to the substrate to a uppermost interlevel dielectric layer furthest from the substrate, each interlevel dielectric layer of the set of interlevel dielectric layers including electrically conductive wires, top surfaces of the wires substantially coplanar with top surfaces of corresponding interlevel dielectric layers; forming a dielectric passivation layer on the uppermost interlevel dielectric layer and the top surfaces of the wires of the uppermost interlevel dielectric layer; forming an organic sealant layer on a top surface of the passivation layer; forming an electrically conductive first plating base layer on the top surface of the sealant layer; forming a dielectric layer on a first region of a top surface of the first plating base layer; forming a first region of an electrically conductive second plating base layer on a top surface of the dielectric layer and a second region of the second plating base layer on a region of the top surface of the first plating base layer not covered by the dielectric layer, the first and second regions of the second plating base layer not in physical contact with each other; and forming a first copper block on the first region of the second plating base layer and forming a second copper block on the second region of the second plating base layer.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 8A and 8B illustrate bonding of interconnect structures according to the present invention to higher level of packaging.

DETAILED DESCRIPTION OF THE INVENTION

In order for an isotope to cause alpha particle induced soft errors in an integrated circuit chip two conditions must be met. First, the energy of the emitted alpha particles must be high enough to penetrate through intervening materials to the sensitive portions of the integrated circuit chip and low enough to generate sufficient electron hole/pairs in the sensitive portions of the transistors. Second, the alpha particle flux must be high enough so that the probability of sensitive portions of the transistors being hit by the alpha particles is sufficient to cause a detectable rate of fails.

The solder used in fabricating integrated circuit interconnections may contain $^{210}$Pb, which can emit a beta particle and decay to $^{210}$Bi. $^{210}$Bi can in turn emit a beta particle and decay to $^{210}$Po. $^{210}$Po in turn can emit a 5.3 MeV alpha particle and decay to $^{206}$Pb. It is this alpha particle from $^{210}$Po that causes fails in the integrated circuit chip providing the alpha particle can reach sensitive portions of the integrated circuit chip. This decay chain reaches secular equilibrium after about 27 months.

Ceramic substrates can contain nuclear reaction products of $^{238}$U, $^{235}$U and $^{232}$Th decay chains that produce alpha particles in very short lifetimes. Examples from the $^{238}$U chain include $^{227}$Th, $^{218}$Ra, $^{214}$Po and $^{210}$Po. Examples from the $^{235}$U chain include $^{227}$Th, $^{223}$Ra, $^{219}$Ra, $^{215}$At and $^{211}$Po. Examples from the $^{232}$Th chain include $^{224}$Ra, $^{220}$Rn, $^{216}$Po and $^{212}$Po. The copper blocks, described infra, will absorb or slow down alpha particles emanating from the ceramic substrate particles.

Soft-errors in integrated circuits are caused by ionizing radiation (e.g. alpha particles) passing through the semiconductor materials (e.g., silicon) of the integrated circuit. Both logic and memory circuits may be affected. The errors are called "soft" because they generally only persist until the next cycle of the integrated circuit function. As an alpha particle passes through semiconductor material (e.g., silicon) a "cloud" of electron-hole pairs is generated in the vicinity of its path. Electric fields present in the integrated circuit can cause the holes and electrons to migrate in opposite directions thus causing extra charge to reach particular circuit nodes and upset the function of the integrated circuit.

Figure 1:
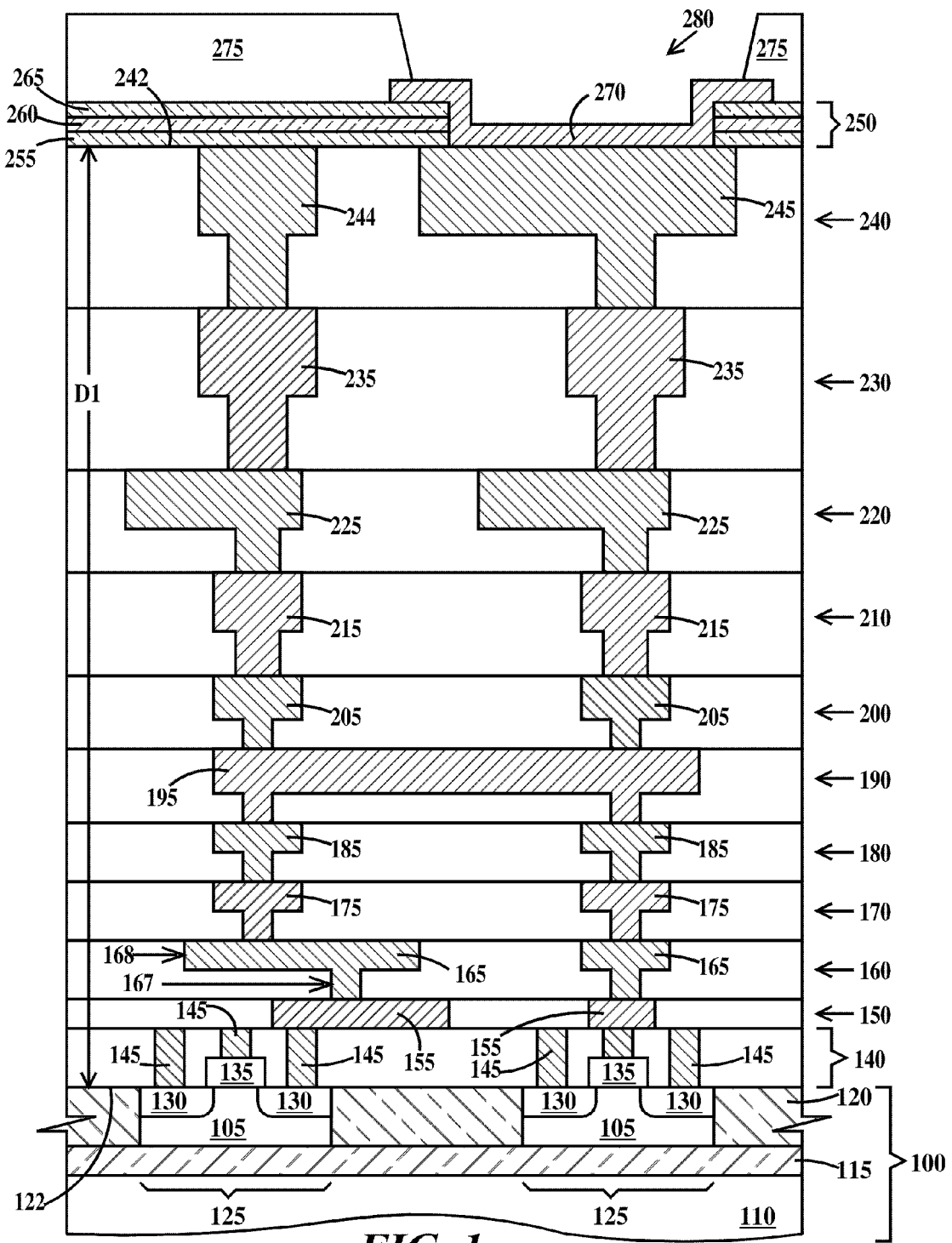
FIG. 1 is a cross-sectional view of an integrated circuit chip up to and including a terminal pad level of an exemplarily integrated circuit upon which the embodiments of the present invention may be practiced.

FIG. 1 is a cross-sectional view of an integrated circuit chip up to and including a terminal pad level of an exemplarily integrated circuit upon which the embodiments of the present invention may be practiced. In FIG. 1, a silicon on insulator (SOI) substrate 100 includes an upper single-crystal silicon layer separated from a lower silicon layer 110 by a buried oxide (BOX) layer 115. Formed in silicon layer 105 is dielectric isolation 120. Dielectric isolation 120 extends from a top surface 122 of silicon layer 105 to a top surface of BOX layer 115. Formed in/on silicon layer 105 are field effect transistors 125. Field effect transistors (FETs) 125 include source/drains 130 and (e.g., polysilicon) gate electrodes 135. A gate dielectric layer between gate electrodes 130 and silicon layer 105 is not shown in FIG. 1. Alpha particles striking the silicon regions of FETs 125 are exemplary of alpha particle strikes that may cause a soft-error fails. FETs 125 may be re-channel FETs (NFETs) or p-channel FETs (PFETs). SOI substrate 100 may be replaced by a bulk silicon substrate (e.g., no BOX).

Formed on top of silicon layer 105/dielectric isolation 120 is a dielectric layer 140. Dielectric layer 140 includes electrically conductive metal stud contacts 145 contacting source/drains 130 and gate electrodes 135 of FETs 125. In one example, stud contacts 145 comprise tungsten.

Formed on top of dielectric layer 140 is a first interlevel dielectric layer (ILD) 150. Formed in first ILD 150 are single damascene wires 155 electrically contacting corresponding stud contacts 145. A single damascene process is one in which wire trenches or via openings are formed in a dielectric layer, an electrical conductor of sufficient thickness to fill the trenches or via openings is deposited on a top surface of the dielectric, and a chemical-mechanical-polish (CMP) process is performed to remove excess conductor material and make the surface of the conductor substantially co-planar with the surface of the dielectric layer to form damascene wires (or damascene vias).

Formed on top of first ILD layer 150 is a second ILD layer 160. Formed in second ILD layer 160 are dual-damascene wires 165 electrically contacting corresponding wires 155. A dual-damascene process is one in which both trench and via openings are filled simultaneously in one step with the electrically conductive material.

Formed on top of second ILD layer 160 is a third ILD layer 170. Formed in third ILD layer 170 are dual-damascene wires 175 electrically contacting corresponding wires 165. Formed on top of third ILD layer 170 is a fourth ILD layer 180. Formed in fourth ILD layer 180 are dual-damascene wires 185 electrically contacting corresponding wires 175. Formed on top of fourth ILD layer 180 is a fifth ILD layer 190. Formed in fifth ILD layer 190 are dual-damascene wires 195 electrically contacting corresponding wires 185. Formed on top of fifth ILD layer 190 is a sixth ILD layer 200. Formed in sixth ILD layer 200 are dual-damascene wires 205 electrically contacting corresponding wires 195. Formed on top of sixth ILD layer 200 is a seventh ILD layer 210. Formed in seventh ILD layer 210 are dual-damascene wires 215 electrically contacting corresponding wires 205. Formed on top of seventh ILD layer 210 is an eighth ILD layer 220. Formed in eighth ILD layer 220 are dual-damascene wires 225 electrically contacting corresponding wires 215. Formed on top of eight ILD layer 220 is a ninth ILD layer 230. Formed in ninth ILD layer 230 are dual-damascene wires 235 electrically contacting corresponding wires 225. Formed on top of ninth ILD layer 230 is a tenth ILD layer 240. Formed in tenth ILD layer 240 (having a top surface 242) are a dual-damascene wire 244 and a dual-damascene wire pad 245 electrically contacting corresponding wires 235. While ten ILD layers hare illustrated in FIG. 1, there may be as few as one or two ILD layers or greater than ten ILD layers.

Dielectric layer 140 and ILD layers 150, 160, 170, 180, 190, 200, 210, 220, 230 and 240 may independently comprise one or more layers of materials selected from the group consisting of hydrogen silsesquioxane polymer (HSQ), methyl silsesquioxane polymer (MSQ), SILK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH, other low K (dielectric constant) dielectric material, silicon dioxide ($SiO_2$), silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$), tetraethoxysilane (TEOS) oxide, fluorinated TEOS (FTEOS) oxide and NBLoK (SiC(N,H)). A low K dielectric material has a relative permittivity of about 2.4 or less.

In, one example, wires 155, 165, 175, 185, 195, 205, 215, 225, 235 and 245 independently comprise copper. In, one example, wires 155, 165, 175, 185, 195, 205, 215, 225, 235 and 245 independently comprise a copper core conductor surrounded on the sides and bottom with an electrically conductive liner. In one example, the electrically conductive liner comprises a layer of Tantalum (Ta) on the copper and a layer of tantalum nitride (TaN) on the Ta layer.

Formed on top of ILD layer 240, wire 244 and overlapping all edges of wire pad 245 is a passivation layer 250. In the example of FIG. 1, passivation layer 250 comprises a first layer 255 in contact with top surface 242 of ILD layer 240, a second layer 260 on top of first layer 255 and a third layer 265 on top of second layer 260. In one example, first layer 255 comprises N-BloK, second layer 260 comprises $SiO_2$ and third layer 265 comprises $Si_3N_4$. In one example first layer 255 is between about 50 and about 200 nm thick, second layer 260 is between about 200 nm and about 900 nm thick, and third layer 265 is between about 100 and 400 nm thick.

A terminal pad 270 is formed on wire pad 245. Terminal pad 270 overlaps all edges of passivation layer 250 that extend over wire pad 245 (i.e., all the edges of passivation layer 250 are "sandwiched" between wire pad 245 and terminal pad 270). Terminal pad 270 is in direct physical and electrical contact with wire pad 245. In one example, terminal pad 270 comprises in sequence, a layer of TaN, a layer of Ti on top of the layer of TaN, a layer of TiN on top of the layer of Ti and a layer of AlCu on top of the layer of TiN. In one example, terminal pad 270 is between about 600 nm and about 2400 nm thick.

A sealant layer 275 is formed over passivation layer 250. Sealant layer 275 extends over all edges of terminal pad 270 (i.e., all the edges of terminal pad 270 are "sandwiched" between passivation layer 250 and sealant layer 275) and the terminal pad is exposed in a terminal via 280 formed in sealant layer 275. In one example, sealant layer 275 is polyimide or photosensitive polyimide. In one example sealant layer 275 is between about 1500 nm and about 3000 nm thick.

In one example, the structure above top surface 242 of ILD layer 240 may be formed by (1) Deposition of passivation layer 250, (2) etching an opening in passivation layer 250 over wire pad 245, (3) depositing one or more electrically conductive layers and photolithographically defining (apply a photoresist layer, exposure the photoresist layer to actinic radiation, and then develop the exposed photoresist layer to remove portions of the exposed photoresist layer) and then etching the conductive layer to form terminal pad 270, (4) applying photo-sensitive polyimide to form sealant layer 275, and (5) photolithography defining and developing via 280 in the sealant layer.

In conventional processing, a relatively thin plating base is formed over terminal pad 270 and a Pb or Pb/Sn solder ball (or column) is formed on the plating base. As discussed supra, alpha particles striking the silicon portions of FETs 125 can cause soft errors. Thus, the only protection from energetic alpha particles generated in the solder ball would be the materials in dielectric layer 140 and ILD layers 150, 160, 170, 180, 190, 200, 210, 220, 230 and 240 of FIG. 1 (particularly the metal wires and contacts) having a combined thickness D1. In one example D1 is about 11 microns or less. Assuming about an average 50% by volume wiring density for dielectric layer 140 and ILD layers 150, 160, 170, 180, 190, 200, 210, 220, 230 and 240 and the wire/dielectric materials described supra, then D1 would need to be about 12 microns to stop 5.3 MeV alpha particles or about 22 microns to stop 8.8 MeV alpha particles generated in the solder ball from penetrating into silicon layer 105. Thus additional blocking material is required and is provided in the various embodiments of the present invention described infra.

Figure 2A:
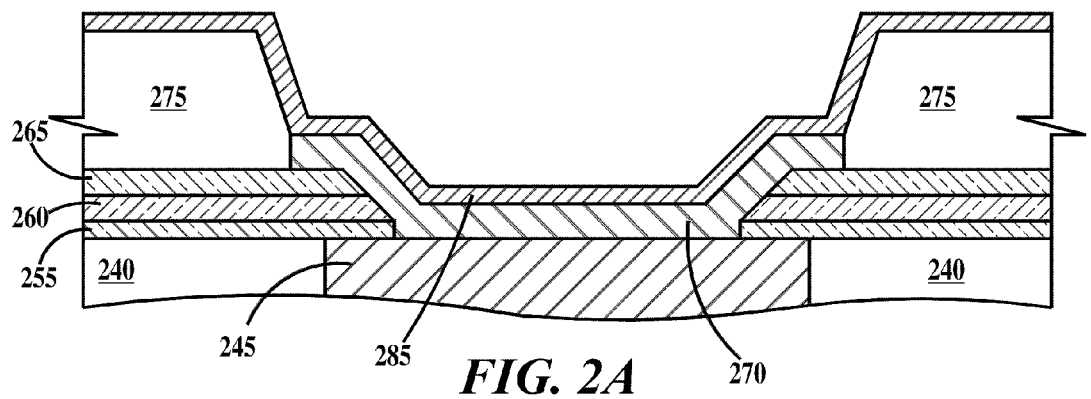
FIGS. 2A through 2F are cross-sections illustrating fabrication of an interconnect structure according to embodiments of the present invention.

FIGS. 2A through 2F are cross-sections illustrating fabrication of an interconnect structure according to embodiments of the present invention. In FIG. 2A, a plating base layer 285 is formed on the top surfaces of sealant layer 275 and terminal pad 270. In one example, plating base layer 285 comprises three layers; a layer of TiW, a layer of CuCr over the TiW layer and a layer of Cu over the CuCr layer. In one example plating base layer 285 is between 400 nm and about 1,000 nm thick.

Figure 2B:
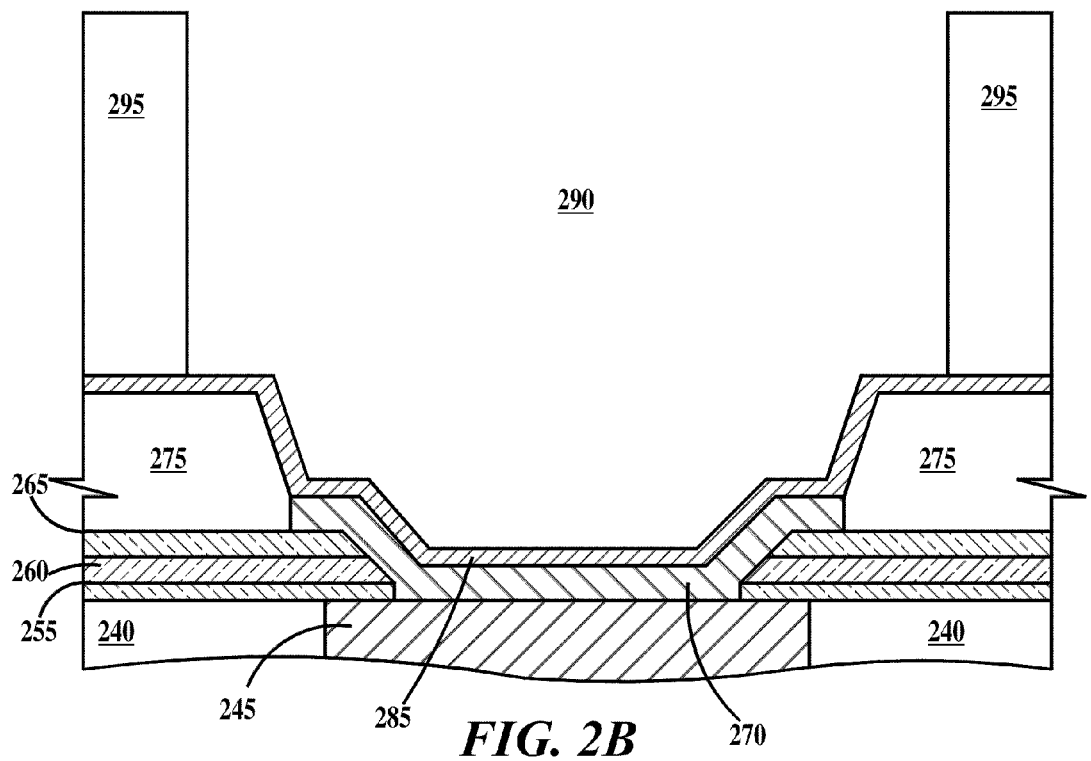
Figure 2C:
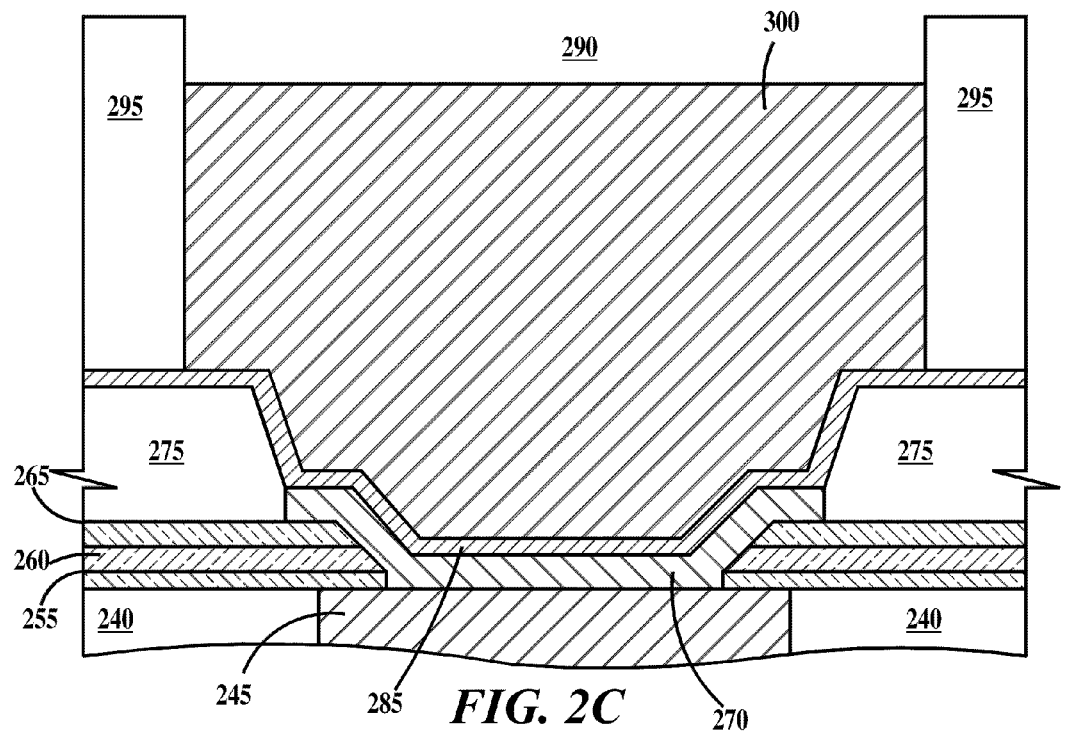
Figure 2D:
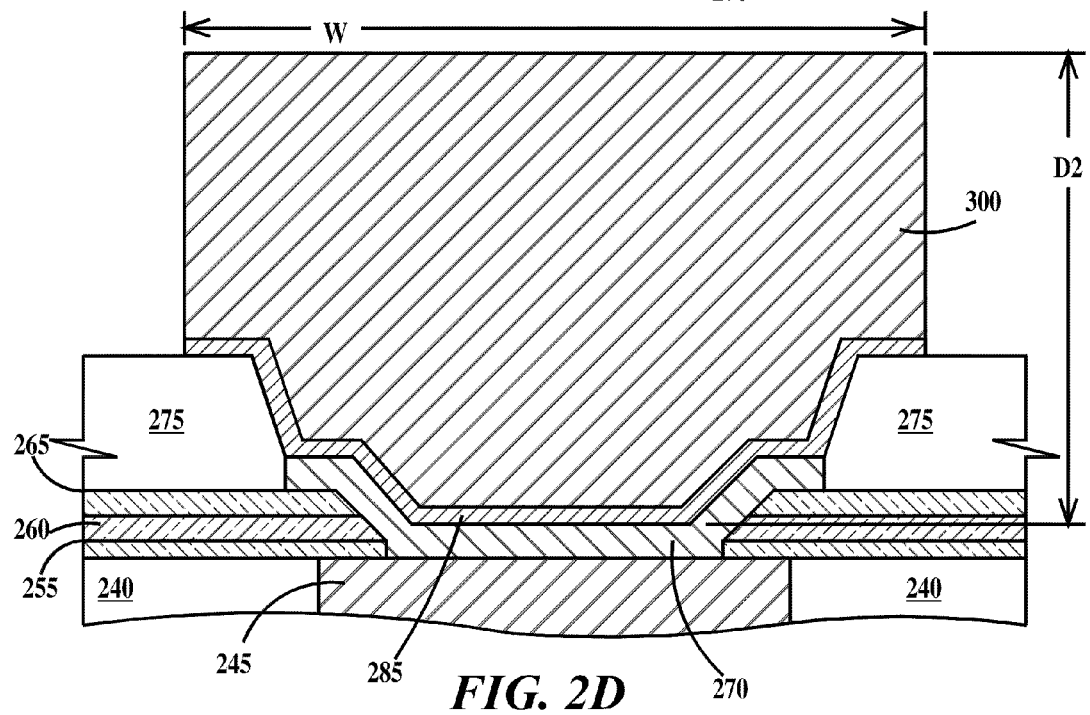

In FIG. 2B, a opening 290 has been photolithographically formed in a photoresist layer 295 that has been applied on plating base layer 285. Opening 290 is formed over terminal pad 270. In FIG. 2C, a copper block 300 is formed by electroplating copper onto plating base layer 285 exposed in opening 290. In FIG. 2D, photoresist layer 295 (see FIG. 2C) is removed and portions of plating base layer 285 not protected by copper block 300 are etched away. Copper block 300 has a thickness D2 and a width W. In one example, W is about 50 microns to about 200 microns and D2 is about 10 microns to about 80 microns. Integrated circuit chips having copper blocks 300 may be used in copper-to-copper bonding to a integrated circuit chip module. Adding the D2 thickness to the D1 thickness of FIG. 1, a total thickness of about 21 microns to about 91 microns results, which is more than sufficient to prevent 5.3 MeV and/or 8.8 MeV alpha particles from penetrating to silicon layer 105 (see FIG. 1). In one example, D2 is great enough to stop 5.3 MeV and/or 8.8 MeV alpha particles from penetrating to silicon layer 105 (see FIG. 1). In one example, D1+D2 is great enough to stop 5.3 MeV and/or 8.8 MeV alpha particles from penetrating to silicon layer 105 (see FIG. 1).

Figure 2E:
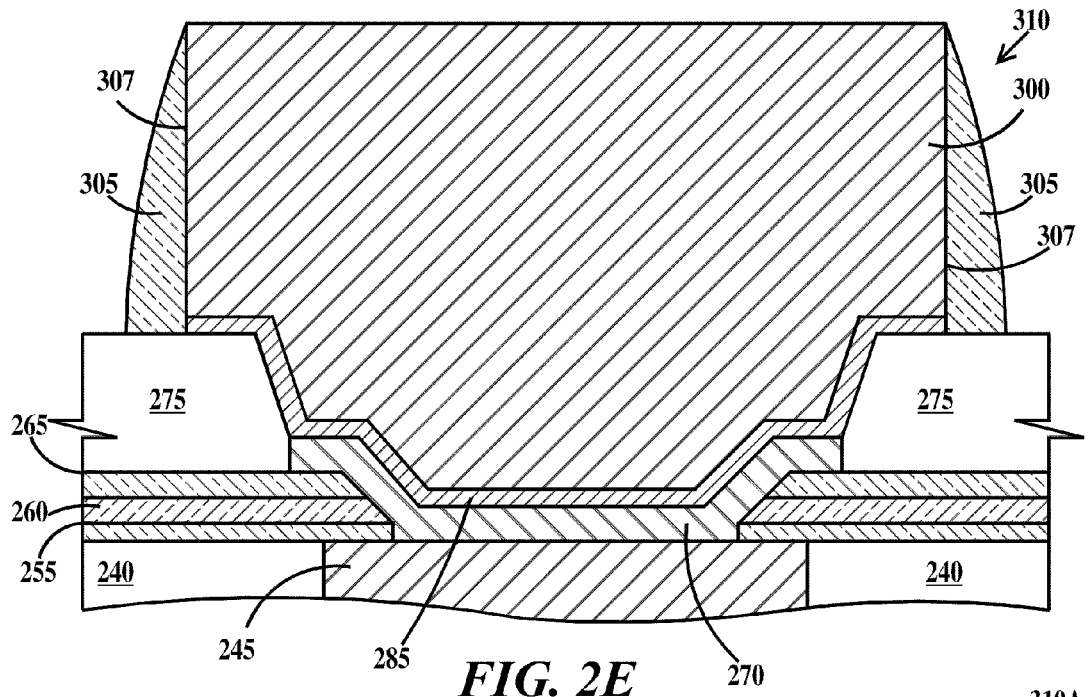
Figure 2F:
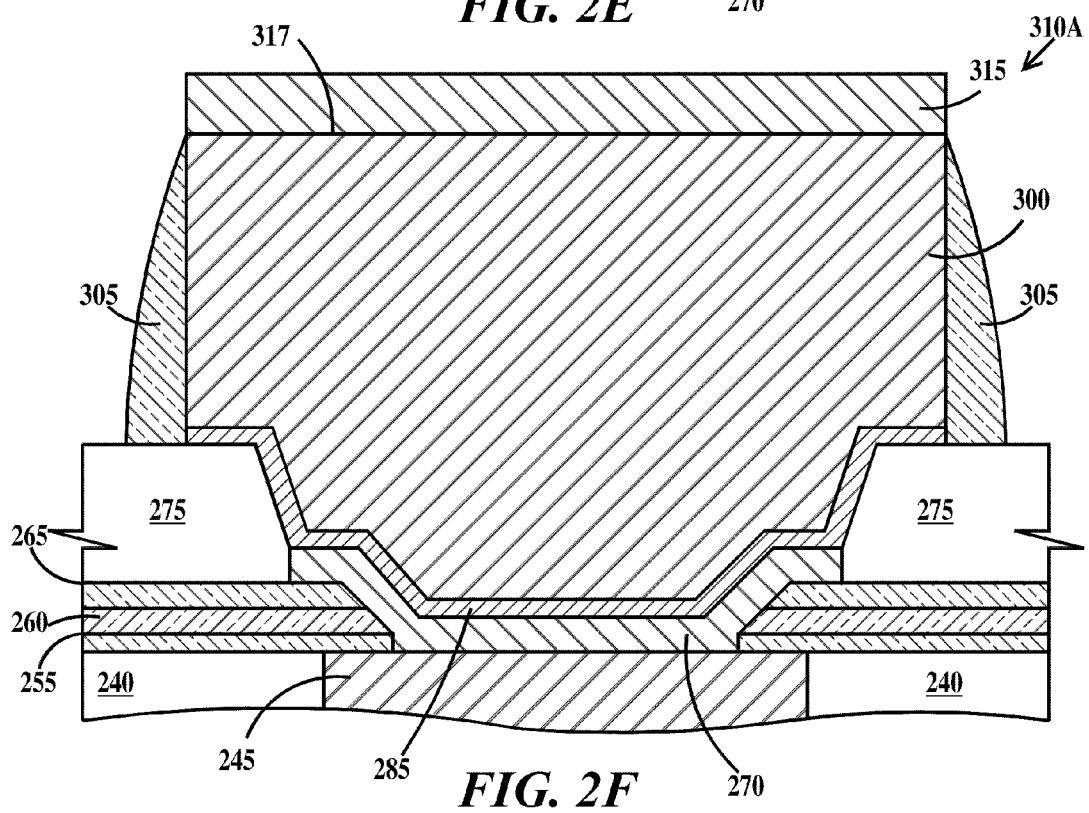

In FIG. 2E, optional dielectric sidewall spacers 305 are formed on the sides 307 of copper block 300 to form a copper interconnect 310. In one example, sidewall spacers comprise $SiO_2$ and are formed by depositing a conformal coating of $SiO_2$, followed by a reactive ion etch (RIE). Integrated circuit chips having interconnects 310 may be used in copper-to-copper bonding to an integrated circuit chip module or in solder bonding to an integrated circuit chip module where the solder is first attached to integrated circuit chip module. Note spacers 305 contact sealant layer 275. In FIG. 2F, a Pb-free, Pb or Pb/Sn solder layer 315 is electroless plated on a top surface 317 of copper block 300 to formed a copper/solder interconnect 310A. Integrated circuit chips having interconnects 310A may be used in solder bonding to integrated circuit chip modules.

Figure 3A:
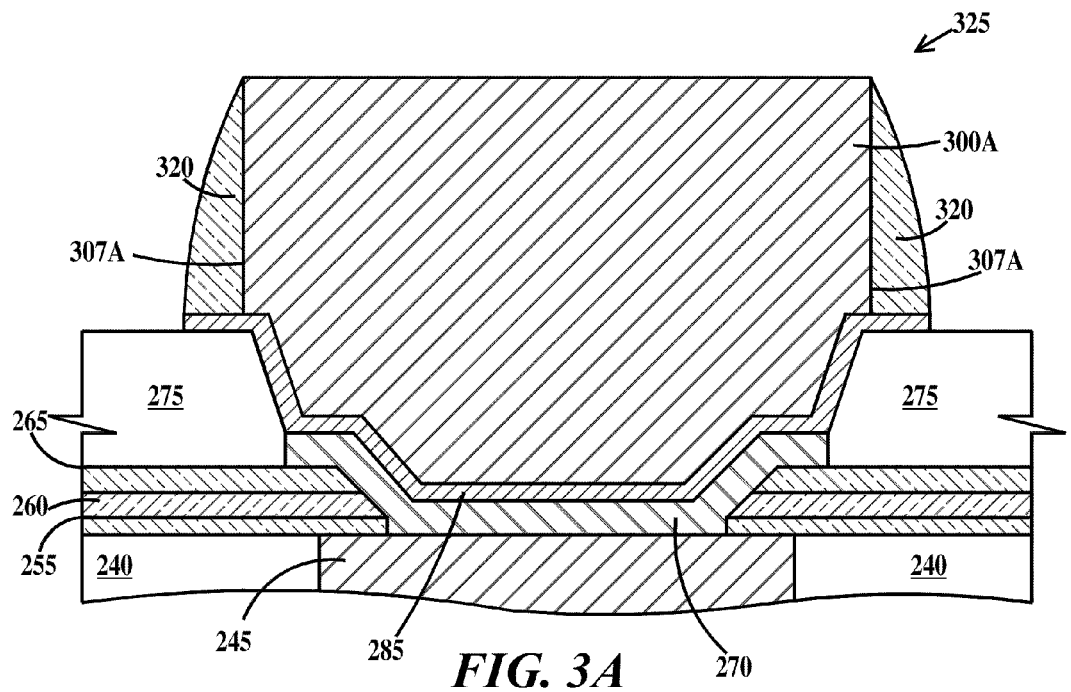
FIGS. 3A and 3B illustrate alternative fabrication steps to those of FIGS. 2E and 2F according to embodiments of the present invention.
Figure 3B:
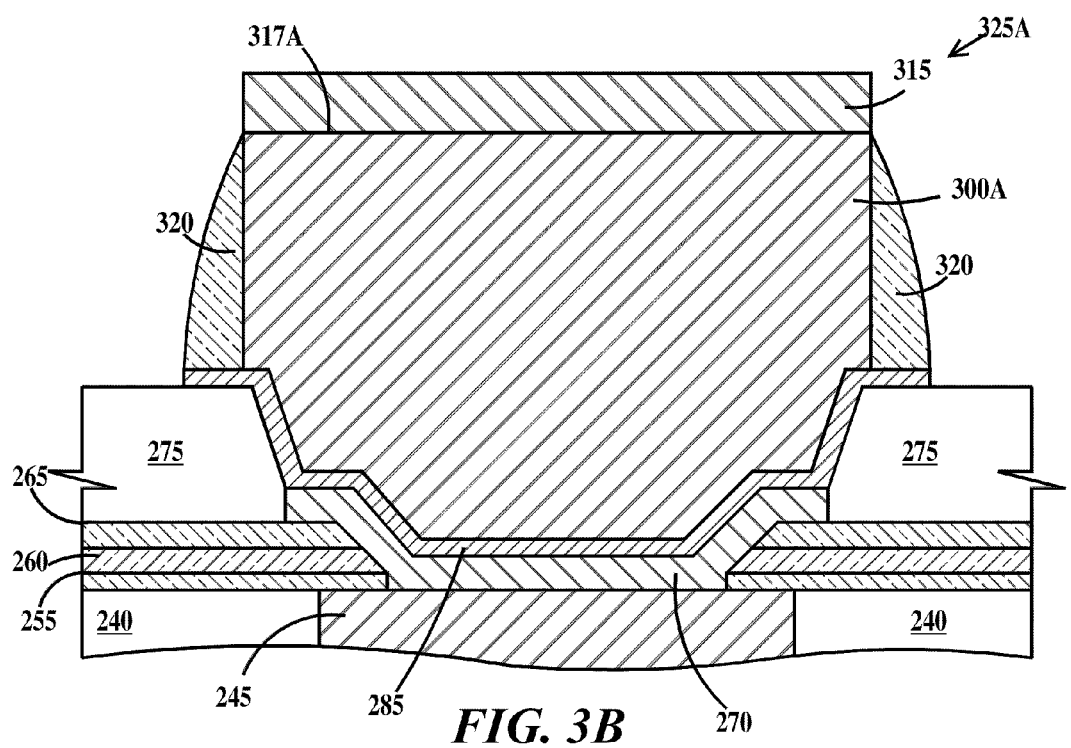

FIGS. 3A and 3B illustrate alternative fabrication steps to those of FIGS. 2E and 2F according to embodiments of the present invention. In FIG. 3A, after removing photoresist layer 295 (see FIG. 2D), a oxidation of all exposed surfaces of copper block 300 (see FIG. 2D) has been performed and then the copper oxide from the top surface of the copper block (along with unprotected regions of plating base later 285) is removed (e.g., using an RIE) leaving copper oxide sidewall spacers 320 on sides 307A of a smaller copper block 300A to form a copper interconnect 325. Note spacers 320 do not contact sealant layer 275, but sit on top of plating base layer 285. In FIG. 3B, solder layer 315 is electroless plated on a top surface 317A of copper block 300A to formed a copper/solder interconnect 325A.

Figure 4A:
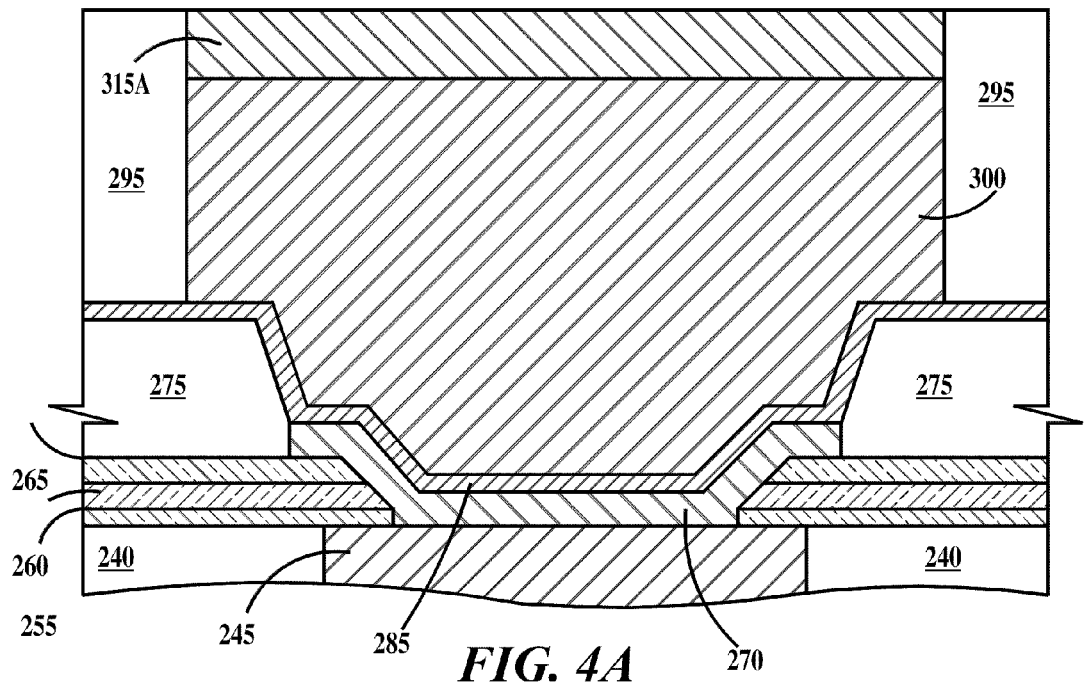
FIGS. 4A and 4B is illustrate alternative fabrication steps to those of FIGS. 2D through 2F according to embodiments of the present invention.
Figure 4B:
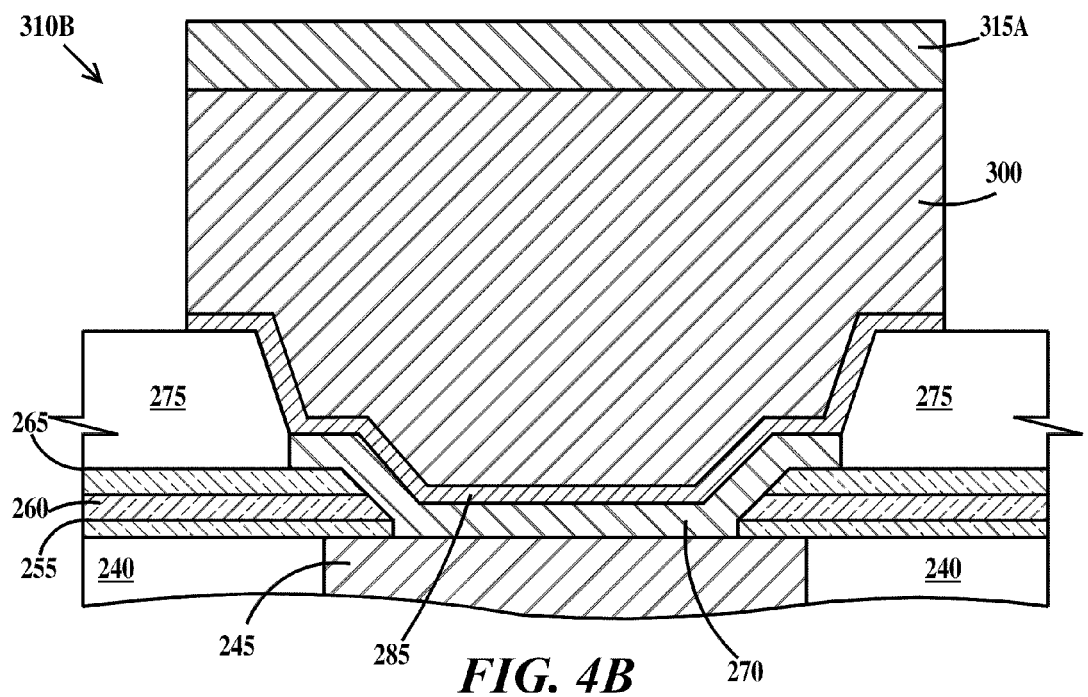

FIGS. 4 A and 4B is illustrate alternative fabrication steps to those of FIGS. 2D through 2F according to embodiments of the present invention. In FIG. 4A, after copper block 300 is plated in (as illustrated in FIG. 2C) a Pb or Pb/Sn solder layer 315A is electroplated on top of copper block 300 to fatal an interconnect 310B. In FIG. 4B, photoresist layer 295 (see FIG. 4A) is removed. Additionally, optional dielectric sidewall spacers may be formed on the sides of interconnect 310B.

Figure 5:
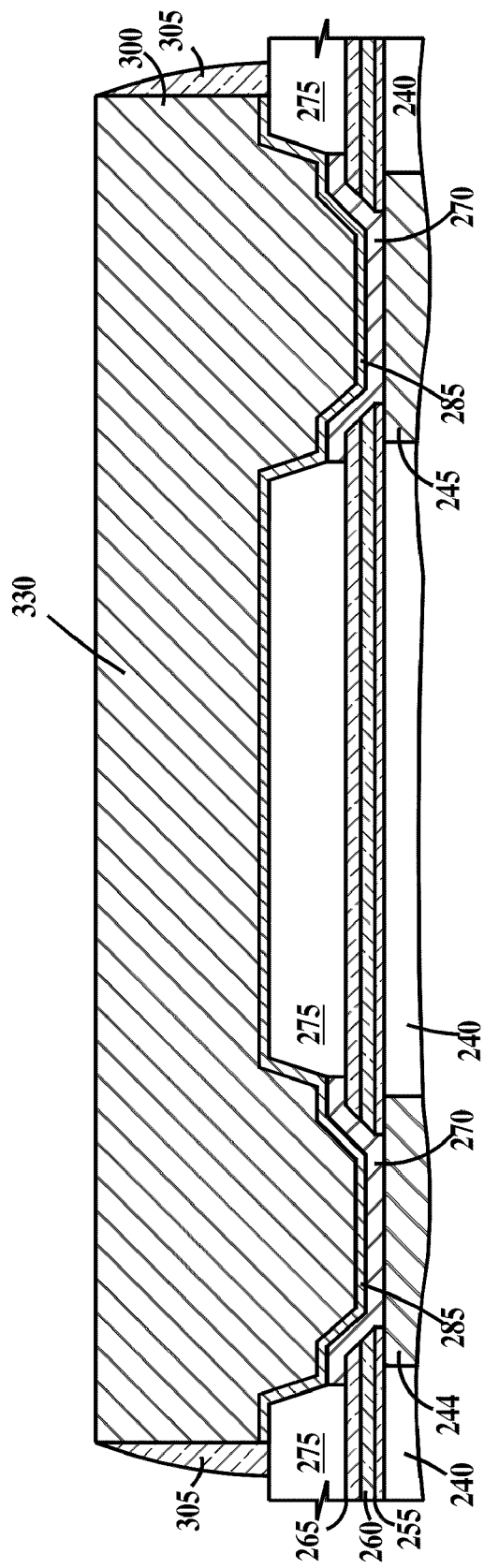
FIG. 5 is a cross-section of an ultra-fat wire fabricated according to the embodiments of the present invention.

FIG. 5 is a cross-section of an ultra-fat wire fabricated according to the embodiments of the present invention. In FIG. 5, the methods described supra, in reference to forming copper blocks 300, may be used to form an ultra-fat wire 330 connecting two wires 244 (see FIG. 1 as well). Thus an additional wiring level has been provided in addition to the wires provided by ILD layers 150 through 240 (see FIG. 1).

Figure 6:
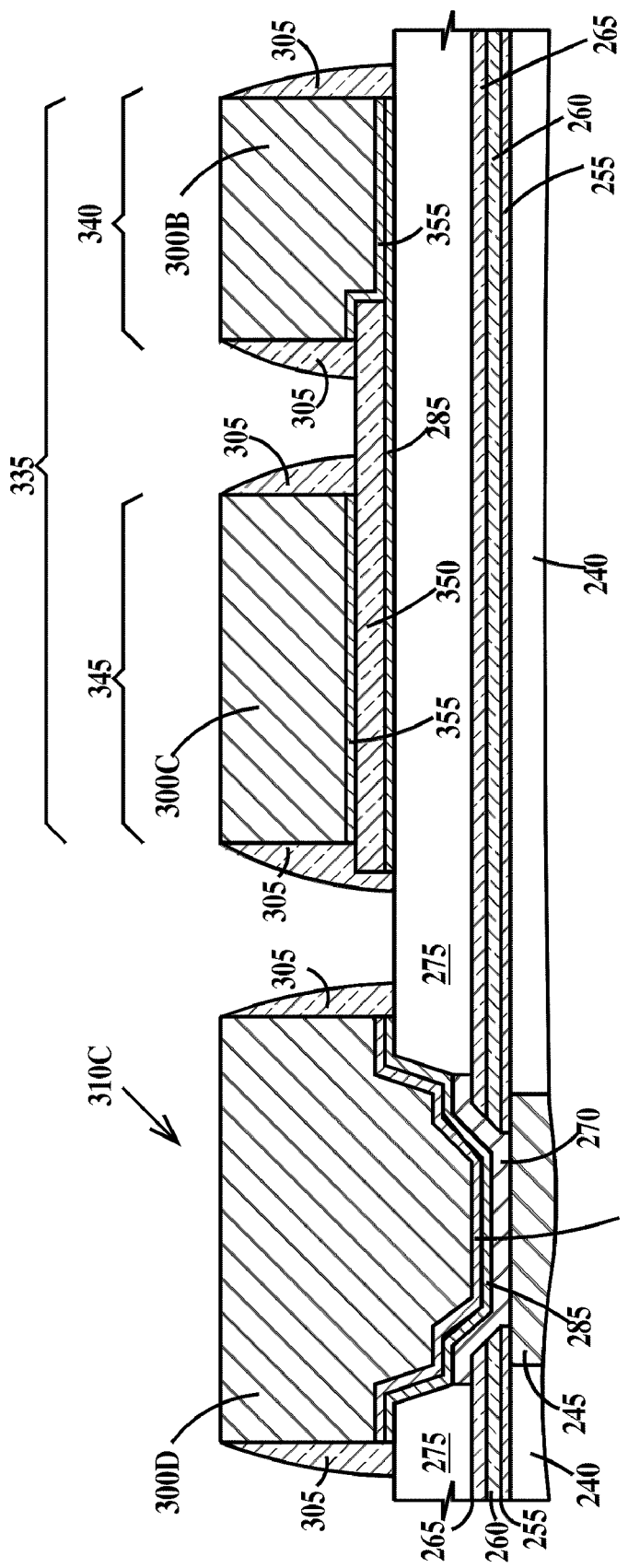
FIG. 6 is a cross-section of a capacitor fabricated according to the embodiments of the present invention.

FIG. 6 is a cross-section of a capacitor fabricated according to the embodiments of the present invention. In FIG. 6, the methods described supra (with some modifications described infra), in reference to forming copper blocks 300, may be used to form a capacitor 335. Capacitor 335 includes a first plate contact 340, an upper plate contact 345 and a capacitor dielectric layer 350. plating base layer 285 serves as the lower plate of capacitor 335 and an additional plating base layer 355 serves as the upper plate of capacitor 335. Lower plate contact 340 includes a copper block 300B on a portion of additional plating base layer 355 that electrically contacts a portion of plating base layer 285 that serves as the lower plate of capacitor 335. Upper plate contact includes copper block 300C that electrically contacts a portion of plating base layer 355 that serves as the upper plate of capacitor 335. Note, an interconnect 310C includes a copper block 300D formed on a portion of additional plating base layer 355 which in turn is formed on plating base layer 285. In one example, dielectric layer 350 comprises $SiO_2$ or $Si_3N_4$. In one example gate dielectric layer 350 is a high K material, examples of which include but are not limited metal oxides such as $Ta_2O_5$, $BaTiO_3$, $HfO_2$, $ZrO_2$, $Al_2O_3$, or metal silicates such as $HfSi_xO_y$, or $HfSi_xO_yN_z$ or combinations of layers thereof. A high K dielectric material has a relative permittivity above about 10. In one example, dielectric layer 350 is about 0.5 nm to 20 nm thick. An additional high K dielectric is a photosensitive polyimide, which has particles of high K materials that are physically dispersed in the polymer.

The methods described supra, in reference to forming copper blocks 300, used to form a capacitor 335 are modified to include forming dielectric layer 350 and additional plating base layer 355 and the process sequence would include, in the order listed, (1) forming plating base layer 285, (2) forming dielectric layer 350, (3) photolithographically defining the extent of dielectric layer 350 and then etching dielectric layer 350, and (4) forming additional plating base layer 355.

Figure 7:
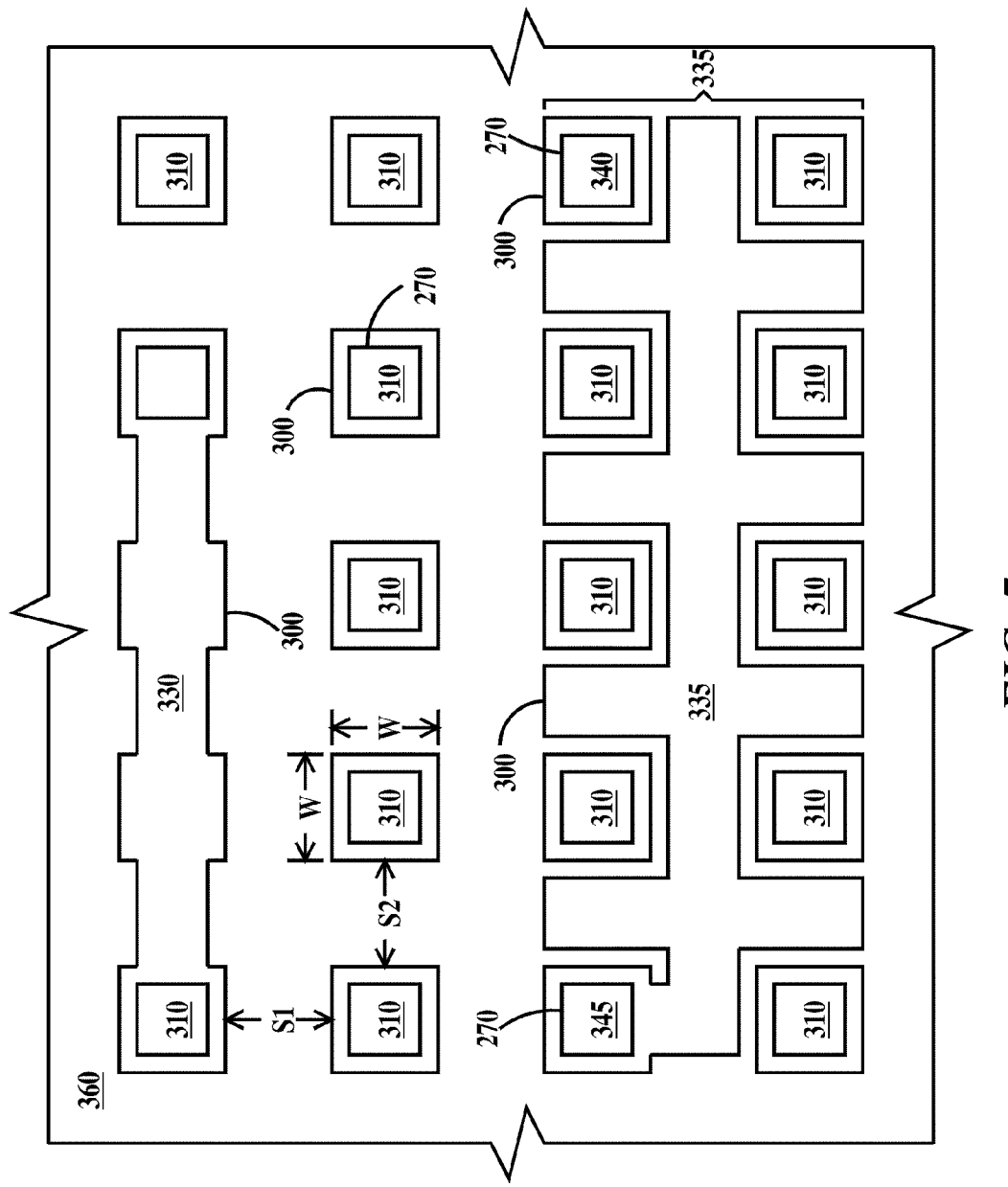
FIG. 7 is a top layout view of an integrated circuit chip containing structures according to the embodiments of the present invention.

FIG. 7 is a top layout view of an integrated circuit chip containing structures according to the embodiments of the present invention. FIG. 7, illustrates interconnects 310, ultra-fat wire 330 and capacitor 335. In FIG. 7, interconnects 310 are spaced apart a distance S1 in a first direction and a distance S2 in a second direction, orthogonal to the first direction. In one example S1=S2. In one example, S1=S2=W. While all structures are laid out on the interconnect grid center-to-center spacing of (S1+W)/2, (S2+W)/2, other layouts are possible. Interconnects 310 may be replaced by copper interconnects 310A of FIG. 2F, 310B of FIG. 4B, 310C of FIG. 6, 325 of FIG. 3A, 325A of FIG. 3B, or copper block 300 of FIG. 2D.

FIGS. 8A and 8B illustrate bonding of interconnect structures according to the present invention to higher level of packaging. In FIG. 8A, an integrated circuit chip module 365 includes a substrate 370 (which may be a ceramic substrate and which may be an alpha particle emitter) and a copper module pad 375. A copper block 300 (of an interconnect 310, see FIG. 2E) is copper-to-copper bonded to module pad 375. An optional epoxy filler 380 is shown injected between integrated circuit chip module 365 and an integrated circuit chip 385. Interconnect 310 may be replaced by interconnect 325 of FIG. 3A or copper block 300 of FIG. 2D.

In FIG. 8B, a copper block 300 (of an interconnect 310A, see FIG. 2F) is solder bonded to module pad 375. Optional epoxy filler 380 is shown injected between integrated circuit chip module 365 and an integrated circuit chip 385. Interconnect 310A may be replaced by interconnect 325A of FIG. 3B or 310B of FIG. 4B.

Thus, the embodiments of the present invention provide improved methods and structures that prevent alpha particles generated in solder used to interconnect integrated circuit chips to a next higher packaging structure (e.g. integrated circuit chip module or circuit board) from reaching the alpha particle sensitive regions of integrated circuit chips.

Thus, in a first example, the embodiments of the present invention provide a structure wherein the copper block has a thickness (i) sufficient to lower the probability of 5.3 MeV or 8.8 MeV alpha particle penetration into a specified interlevel dielectric layer of the set of dielectric layers to a specified probability or (ii) sufficient to fully absorb all 5.3 MeV or 8.8 MeV alpha particles striking a top surface of the copper block to prevent penetration of the alpha particles into silicon regions of the semiconductor substrate.

In a second example, the embodiments of the present invention provide a structure wherein the copper block has a thickness that when added to a combined thickness of the set of interlevel dielectric layers is (i) sufficient to lower the probability of penetration below a specified interlevel dielectric layer of the set of dielectric layers to a specified probability of alpha particles of 5.3 MeV or 8.8 MeV striking a top surface of the copper block or (ii) sufficient to fully absorb all alpha particles of 5.3 MeV or 8.8 MeV striking a top surface of the copper block to prevent penetration of the alpha particles into silicon regions of the semiconductor substrate.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   a semiconductor substrate;
   a set of interlevel dielectric layers stacked from a lowermost interlevel dielectric layer closest to said substrate to a uppermost interlevel dielectric layer furthest from said substrate, each interlevel dielectric layer of said set of interlevel dielectric layers including electrically conductive wires, top surfaces of said wires substantially coplanar with top surfaces of corresponding interlevel dielectric layers;
   an electrically conductive terminal pad contacting a wire pad of said uppermost interlevel dielectric layer;
   an electrically conductive plating base layer contacting a top surface of said terminal pad;
   an organic sealing layer between said plating base layer and said uppermost interlevel dielectric layer, said terminal pad exposed in an opening in said organic sealing layer; said plating base layer overlapping all edges of said organic sealing layer proximate to said terminal pad; and
   a copper block on said plating base layer.

2. The structure of claim 1, further including:
a ceramic module having a copper pad, said copper pad copper-to-copper bonded to said copper block.

3. The structure of claim 1, further including:
a layer of lead-free solder, lead solder or lead/tin solder on a top surface of said copper block.

4. The structure of claim 1, further including:
a ceramic module having a copper pad, said copper pad soldered to said copper block.

5. The structure of claim 1, further including:
dielectric sidewall spacers on sidewalls of said copper block, said dielectric spacers contacting said top surface of said sealant layer.

6. The structure of claim 1, further including:
dielectric sidewall spacers on sidewalls of said copper block, said dielectric spacers contacting said top surface of said plating base layer but not contacting said top surface of said sealant layer.

7. The structure of claim 1, wherein said copper block has a thickness (i) sufficient to lower the probability of 5.3 MeV or 8.8 MeV alpha particle penetration into a specified interlevel dielectric layer of said set of dielectric layers to a specified probability or (ii) sufficient to fully absorb all 5.3 MeV or 8.8 MeV alpha particles striking a top surface of said copper block to prevent penetration of said alpha particles into silicon regions of said semiconductor substrate.

8. The structure of claim 1, wherein said copper block has a thickness that when added to a combined thickness of said set of interlevel dielectric layers is (i) sufficient to lower the probability of 5.3 MeV or 8.8 MeV alpha particle penetration into a specified interlevel dielectric layer of said set of dielectric layers to a specified probability or (ii) sufficient to fully absorb all 5.3 MeV or 8.8 MeV alpha particles striking a top surface of said copper block to prevent penetration of said alpha particles into silicon regions of said semiconductor substrate.

9. The structure of claim 1, further including:
a dielectric passivation layer on said uppermost interlevel dielectric layer and said top surfaces of wires of said uppermost interlevel dielectric layer, a region of a top surface of said wire pad of said uppermost interlevel dielectric layer exposed in an opening in said passivation layer, said passivation layer overlapping all edges of said wire pad, said terminal pad contacting said region of said top surface of said wire pad, said terminal pad overlapping all edges of said opening in said passivation layer; and
said organic sealant layer formed on a top surface of said passivation layer and abutting said terminal pad.

10. The structure of claim 9, further including:
a region of a top surface of an additional wire pad of said uppermost interlevel dielectric layer exposed in an additional opening in said passivation layer, said passivation layer overlapping all edges of said additional wire pad, said additional wire pad spaced away from said wire pad;
an electrically conductive additional terminal pad contacting said region of said top surface of said additional wire pad, said additional terminal pad overlapping all edges of said opening in said passivation layer;
said sealant layer abutting said additional terminal pad; and
said plating base layer extending along a top surface of said sealant layer between said terminal pad and said additional terminal pad.

11. A structure, comprising:
a semiconductor substrate;
a set of interlevel dielectric layers stacked from a lowermost interlevel dielectric layer closest to said substrate to a uppermost interlevel dielectric layer furthest from said substrate, each interlevel dielectric layer of said set of interlevel dielectric layers including electrically conductive wires, top surfaces of said wires substantially coplanar with top surfaces of corresponding interlevel dielectric layers;
a dielectric passivation layer on said uppermost interlevel dielectric layer and said top surfaces of said wires of said uppermost interlevel dielectric layer;
an organic sealant layer on a top surface of said passivation layer;
an electrically conductive first plating base layer on said top surface of said sealant layer;
a dielectric layer on a first region of a top surface of said first plating base layer;
a first region of an electrically conductive second plating base layer on a top surface of said dielectric layer and a second region of said second plating base layer on a region of said top surface of said first plating base layer not covered by said dielectric layer, said first and second regions of said second plating base layer not in physical contact;
a first copper block on said first region of said second plating base layer; and
a second copper block on said second region of said second plating base layer.

12. The structure of claim 11, further including:
dielectric sidewall spacers on sidewalls of said first and second copper blocks.

13. The structure of claim 11, wherein said copper block has a thickness (i) sufficient to lower the probability of 5.3 MeV or 8.8 MeV alpha particle penetration into a specified interlevel dielectric layer of said set of dielectric layers to a specified probability or (ii) sufficient to fully absorb all 5.3 MeV or 8.8 MeV alpha particles striking a top surface of said copper block to prevent penetration of said alpha particles into silicon regions of said semiconductor substrate.

14. The structure of claim 11, wherein said copper block has a thickness that when added to a combined thickness of said set of interlevel dielectric layers is (i) sufficient to lower the probability of 5.3 MeV or 8.8 MeV alpha particle penetration into a specified interlevel dielectric layer of said set of dielectric layers to a specified probability or (ii) sufficient to fully absorb all 5.3 MeV or 8.8 MeV alpha particles striking a top surface of said copper block to prevent penetration of said alpha particles into silicon regions of said semiconductor substrate.

15. The structure of claim 11, further including:
a region of a top surface of a wire pad of said uppermost interlevel dielectric layer exposed in an opening in said passivation layer, said passivation layer overlapping all edges of said wire pad;
an electrically conductive terminal pad contacting said region of said top surface of said wire pad, said terminal pad overlapping all edges of said opening in said passivation layer;
said sealant layer abutting said terminal pad;
a second region of said first plating base layer contacting a top surface of said terminal pad and overlapping all edges said sealant layer proximate to said terminal pad, said second region of said first plating base layer not contacting said first region of first plating base layer;

a third region of said second plating base layer contacting said second region of said first plating base layer, said third region of said second plating base layer not contacting said first and second regions of said second plating base layer; and a third copper block on said third region of said second plating base layer.

16. A method, comprising:

forming, on a semiconductor substrate, a set of interlevel dielectric layers stacked from a lowermost interlevel dielectric layer closest to said substrate to a uppermost interlevel dielectric layer furthest from said substrate, each interlevel dielectric layer of said set of interlevel dielectric layers including electrically conductive wires, top surfaces of said wires substantially coplanar with top surfaces of corresponding interlevel dielectric layers;

forming an electrically conductive terminal pad on a wire pad of said uppermost interlevel dielectric layer;

forming an electrically conductive plating base layer contacting a top surface of said terminal pad;

forming an organic sealing layer between said plating base layer and said uppermost interlevel dielectric layer, said terminal pad exposed in an opening in said organic sealing layer; said plating base layer overlapping all edges of said organic sealing layer proximate to said terminal pad; and forming a copper block on said plating base layer.

17. The method of claim 16, wherein said forming said copper block, includes:

forming a photoresist layer on said plating base layer;

forming an opening in said photoresist layer over said terminal pad;

electroplating copper on said plating base layer to form said copper block;

removing said photoresist layer; and removing said plating base layer where said plating base is not protected by said copper block.

18. The method of claim 16, further including:

forming a copper-to-copper bond between a copper pad on a ceramic module and said copper block.

19. The method of claim 16, further including:

forming a layer of lead-free solder, lead solder or lead/tin solder on a top surface of said copper block.

20. The method of claim 16, further including:

forming a solder connection between a copper pad on a ceramic module and said copper block.

21. The method of claim 16, further including:

forming a dielectric passivation layer on said uppermost interlevel dielectric layer and said top surfaces of said wires of said uppermost interlevel dielectric layer;

forming a opening in said passivation layer, a region of a top surface of said wire pad exposed in an opening in said passivation layer, said passivation layer overlapping all edges of said wire pad, said terminal pad contacting said region of said top surface of said wire pad, said terminal pad overlapping all edges of said opening in said passivation layer; and forming said organic sealant layer on a top surface of said passivation layer and abutting said terminal pad.

22. The method of claim 21, further including:

conformally depositing a conformal dielectric layer on exposed surfaces of said copper block and exposed surfaces of said sealant layer; and reactive ion etching said conformal dielectric layer to form dielectric spacers on sidewalls of said copper block, said dielectric spacers contacting said top surface of said sealant layer.

23. The method of claim 21, further including:

oxidizing a layer of copper adjacent to exposed surfaces of said copper block to form a copper oxide layer on exposed surfaces of said copper block; and removing said copper oxide from a top surface of said copper block, said copper oxide layer on said sidewalls of said copper block contacting said top surface of said plating base layer but not contacting said top surface of said sealant layer.

24. The method of claim 21, further including:

forming simultaneously with said opening in said passivation layer, an additional opening in said passivation layer, a region of a top surface of an additional wire pad of said uppermost interlevel dielectric layer exposed in said additional opening, said passivation layer overlapping all edges of said additional wire pad, said additional wire pad spaced away from said wire pad;

forming an electrically conductive additional terminal pad contacting said region of said top surface of said additional wire pad, said additional terminal pad overlapping all edges of said opening in said passivation layer;

said sealant layer abutting said additional terminal pad; and said plating base layer extending along a top surface of said sealant layer between said terminal pad and said additional terminal pad.

25. The method of claim 16, wherein (i) said copper block has a thickness sufficient to lower the probability of 5.3 MeV or 8.8 MeV alpha particle penetration into a specified interlevel dielectric layer of said set of dielectric layers to a specified probability, (ii) said copper block has a thickness sufficient to fully absorb all 5.3 MeV or 8.8 MeV alpha particles striking a top surface of said copper block to prevent penetration of said alpha particles into silicon regions of said semiconductor substrate, (iii) said copper block has a thickness that when added to a combined thickness of said set of interlevel dielectric layers is sufficient to lower the probability of 5.3 MeV or 8.8 MeV alpha particle penetration into a specified interlevel dielectric layer of said set of dielectric layers to a specified probability, or (iv) said copper block has a thickness that when added to a combined thickness of said set of interlevel dielectric layers is sufficient to fully absorb all 5.3 MeV or 8.8 MeV alpha particles striking a top surface of said copper block to prevent penetration of said alpha particles into silicon regions of said semiconductor substrate.

26. A method, comprising:

forming, on a semiconductor substrate, a set of interlevel dielectric layers stacked from a lowermost interlevel dielectric layer closest to said substrate to a uppermost interlevel dielectric layer furthest from said substrate, each interlevel dielectric layer of said set of interlevel dielectric layers including electrically conductive wires, top surfaces of said wires substantially coplanar with top surfaces of corresponding interlevel dielectric layers;

forming a dielectric passivation layer on said uppermost interlevel dielectric layer and said top surfaces of said wires of said uppermost interlevel dielectric layer;

forming an organic sealant layer on a top surface of said passivation layer;

forming an electrically conductive first plating base layer on said top surface of said sealant layer;

forming a dielectric layer on a first region of a top surface of said first plating base layer;

forming a first region of an electrically conductive second plating base layer on a top surface of said dielectric layer and a second region of said second plating base layer on a region of said top surface of said first plating base layer not covered by said dielectric layer, said first and second regions of said second plating base layer not in physical contact with each other; and forming a first copper block on said first region of said second plating base layer and forming a second copper block on said second region of said second plating base layer.

27. The method of claim 26, wherein said forming said first and second copper blocks includes:

simultaneously electroplating copper on said first region of said second plating base layer and on said second region of said second plating base layer through corresponding openings in a photoresist layer;

removing said photoresist layer; and removing said first and second plating base layers where said second plating base is not protected by said first and second copper blocks.

28. The method of claim 26, further including:

simultaneously forming dielectric sidewall spacers on sidewalls of said first and second copper blocks.

29. The method of claim 26, wherein (i) said copper block has a thickness sufficient to lower the probability of 5.3 MeV or 8.8 MeV alpha particle penetration into a specified interlevel dielectric layer of said set of dielectric layers to a specified probability, (ii) said copper block has a thickness sufficient to fully absorb all 5.3 MeV or 8.8 MeV alpha particles striking a top surface of said copper block to prevent penetration of said alpha particles into silicon regions of said semiconductor substrate, (iii) said copper block has a thickness that when added to a combined thickness of said set of interlevel dielectric layers is sufficient to lower the probability of 5.3 MeV or 8.8 MeV alpha particle penetration into a specified interlevel dielectric layer of said set of dielectric layers to a specified probability, or (iv) said copper block has a thickness that when added to a combined thickness of said set of interlevel dielectric layers is sufficient to fully absorb all 5.3 MeV or 8.8 MeV alpha particles striking a top surface of said copper block to prevent penetration of said alpha particles into silicon regions of said semiconductor substrate.

30. The method of claim 26, further including:

forming an opening in said passivation layer, a region of a top surface of a wire pad of said uppermost interlevel dielectric layer exposed in said opening, said passivation layer overlapping all edges of said wire pad;

forming an electrically conductive terminal pad contacting said region of said top surface of said wire pad, said terminal pad overlapping all edges of said opening in said passivation layer;

said sealant layer abutting said terminal pad;

a second region of said first plating base layer contacting a top surface of said terminal pad and overlapping all edges of said sealant layer proximate to said terminal pad, said second region of said first plating base layer not contacting said first region of said first plating base layer;

a third region of said second plating base layer contacting said second region of said first plating base layer, said third region of said second plating base layer not contacting said first and second regions of said second plating base layer; and simultaneously with said electroplating said first copper block, electroplating a third copper block on said third region of said second plating base layer.

* * * * *